United States Patent [19]

Birrittella

[11] Patent Number: 4,641,047
[45] Date of Patent: Feb. 3, 1987

[54] COMPLEX DIRECT COUPLED TRANSISTOR LOGIC

[75] Inventor: Mark S. Birrittella, Phoenix, Ariz.

[73] Assignee: Motorola, Inc., Schaumburg, Ill.

[21] Appl. No.: 627,312

[22] Filed: Jul. 2, 1984

[51] Int. Cl.⁴ ............... H03K 19/082; H03K 19/091; H01L 27/04

[52] U.S. Cl. ..................... 307/454; 357/36; 357/46; 357/92

[58] Field of Search ............... 307/454, 477; 357/92, 357/45, 46, 36

[56] References Cited

U.S. PATENT DOCUMENTS

| | | | |
|---|---|---|---|
| 3,614,468 | 10/1971 | Ehlbeck et al. | 307/454 |
| 3,865,648 | 2/1975 | Castrucci et al. | 357/92 |
| 3,916,218 | 10/1975 | Berger et al. | 357/92 |
| 3,956,641 | 5/1976 | Berger et al. | 307/454 |
| 4,204,130 | 5/1980 | Harris | 357/92 |
| 4,219,828 | 8/1980 | Lardy et al. | 357/23.14 |
| 4,301,382 | 11/1981 | Kameyana | 357/92 |
| 4,518,874 | 5/1985 | Davis et al. | 357/45 |

Primary Examiner—William D. Larkins
Attorney, Agent, or Firm—William E. Koch

[57] ABSTRACT

A logic circuit is provided having increased flexibility, increased package density over I2L circuits and improved noise immunity over ISL circuits. A first NPN multi-collector transistor has its collectors coupled wherein each provide an output signal, and a base connected to an input terminal and to the base of a second NPN transistor. The emitter of the second transistor is coupled to receive a first supply voltage, typically ground. The input terminal is coupled to a second supply voltage by a resistor. When monolithically integrated, the emitter and collector of the first and second transistor, respectively, share a common buried epitaxial layer that does not require contact with a metallization layer.

1 Claim, 3 Drawing Figures

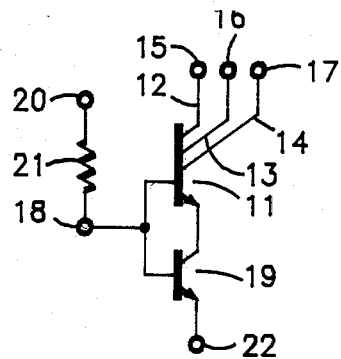
*FIG. 1*
*FIG. 2*
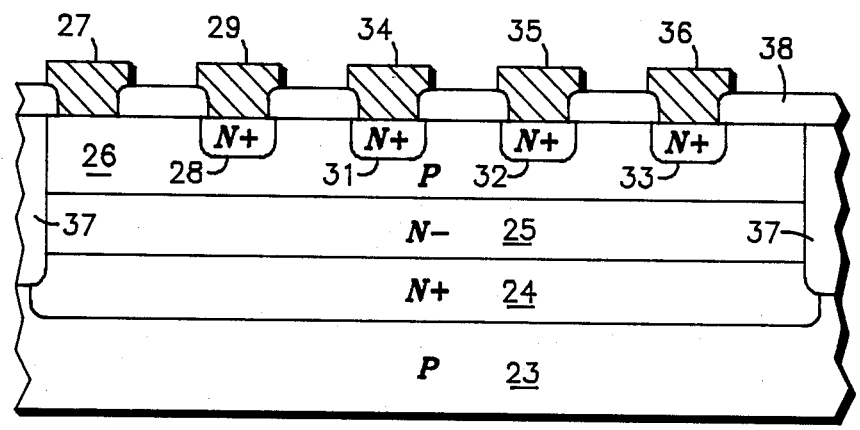
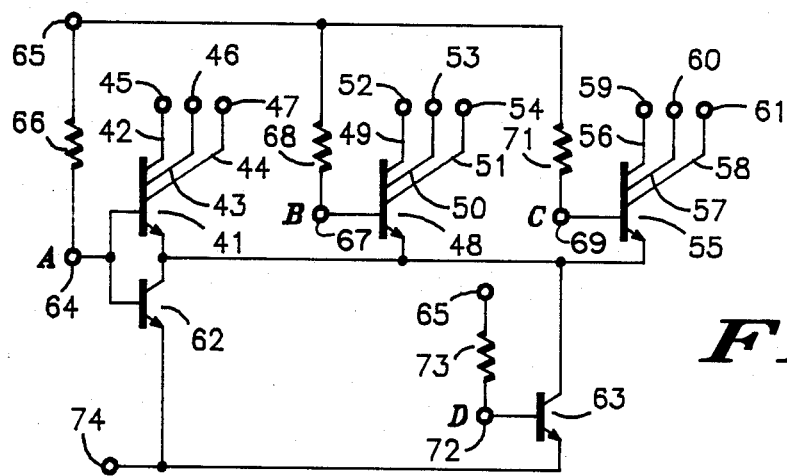
*FIG. 3*

COMPLEX DIRECT COUPLED TRANSISTOR LOGIC

BACKGROUND OF THE INVENTION

1. Field of the Invention

This invention relates generally to logic circuits and, more particularly, to a new type of logic circuit family having increased packing density and logic flexibility.

2. Background Art

Known logic circuit families include both unipolar (FET) and bipolar technology. Particularly well known families include resistor-transistor-logic (RTL), diode-transistor logic (DTL), transistor-transistor-logic (TTL), emitter coupled-logic (ECL), integrated-injection-logic (I$^2$L), and integrated-Schottky-logic (ISL). The invention described herein most closely relates to I$^2$L and ISL; however, advantages over both I$^2$L and ISL will be explained in detail below.

Basic I$^2$L technology comprises a multi-collector NPN transistor, and a PNP transistor serving as a current source. The collector and base of the current source are connected to the base and emitter of the NPN transistor, respectively. The current source thereby injects minority carriers through the base region of the PNP transistor into the base region of the NPN transistor.

It is readily seen, when monolithically integrated, that the base of the NPN transistor is common to the collector of the current source, while the base of the current source is common to the emitter of the NPN transistor. The emitter of the current source is called the injector. On silicon the entire gate takes up the room of a single multi-emitter transistor.

However, the common base of the current source and the emitter of the NPN transistor is a buried epitaxial layer that is connected to a supply voltage (commonly ground), and requires a contact on top of the chip. Normally, several of these contacts are required due to the resistances involved. These multiple contacts have a negative impact on the density of the chip.

Basic ISL technology comprises a single collector NPN transistor wherein the collector has multiple Schottky contacts thereto. A resistor is generally coupled between the base of the NPN transistor and a supply voltage.

However, the Schottky contacts required for the ISL circuit increases processing complexity, results in a smaller logic swing and has a poor noise immunity. The difference in output voltage between a logical high input signal and a logical low input signal is only about 200 millivolts.

Thus, what is needed is a logic circuit having increased flexibility, increased packing density over I$^2$L circuits, and increased noise margin over ISL circuits.

SUMMARY OF THE INVENTION

Accordingly, it is an object of the present invention to provide an improved logic circuit family.

Another object of the present invention is to provide a logic circuit having increased flexibility.

Yet another object of the present invention is to provide a logic circuit having an increased packing density from the previously known I$^2$L technology.

Still another object of the present invention is to provide a logic circuit having an increased noise margin from the previously known ISL technology.

In carrying out the above and other objects of the invention in one form, there is provided a logic circuit comprising a first NPN transistor having a base connected to an input terminal and at least two collectors, an output signal provided from each of the collectors. A second NPN transistor has a base connected to the input terminal, a collector connected to an emitter of the first NPN transistor, and an emitter connected to a supply voltage terminal. The emitter and collector of the first and second transistors share a common buried epitaxial layer and their bases share a common P region overlying the common epitaxial layer.

The above and other objects, features, and advantages of the present invention will be better understood from the following detailed description taken in conjunction with the accompanying drawings.

BRIEF DESCRIPTION OF THE DRAWINGS

FIG. 1 is a schematic of the preferred embodiment of the invention.

FIG. 2 is a monolithically integrated cross-section of a portion of the schematic illustrated in FIG. 1.

FIG. 3 is a schematic of another embodiment of the invention.

DETAILED DESCRIPTION OF THE INVENTION

Referring to FIG. 1, a logic circuit in accordance with the present invention is shown which is suitable to be fabricated in monolithic integrated circuit form. NPN multi-collector transistor 11 has collectors 12, 13 and 14 connected to output terminals 15, 16 and 17, respectively. The base of transistor 11 is connected to input terminal 18 and to the base of NPN transistor 19. Input terminal 18 is coupled to supply voltage (V$_{CC}$) terminal 20 by resistor 21. Transistor 19 has a collector connected to the emitter of transistor 11, and an emitter connected to supply voltage (typically ground) terminal 22.

When a logical low signal is applied to terminal 18, transistors 11 and 19 will be off. When a logical high signal is applied to terminal 18, transistor 19 will turn on first, its emitter injecting electrons into its collector. The collector approaches ground since initially transistor 11 is off. Since the collector of transistor 19 and the emitter of transistor 11 are common, transistor 11 will then turn on when this common region approaches ground. This will cause electrons to be injected into the collectors of transistor 11.

FIG. 2 illustrates how the invention may be monolithically integrated to provided the advantages over both I$^2$L and ISL circuits. The integrated structure is fabricated utilizing conventional processes and includes a P silicon substrate 23. N+ buried layer 24 is formed within substrate 23 and an N− epitaxial layer 25 is grown over N+ buried layer 24. N− layer 25 serves as the common emitter of transistor 11 and the collector of transistor 19. P region 26 is ion implanted into N− layer 25 for serving as the base of transistors 11 and 19, and underlies metal contact 27 for coupling to supply voltage (V$_{CC}$) by resistor 19 which may be located elsewhere on the chip.

N+ region 28 is ion implanted into P region 26 and underlies metal contact 29 for providing the emitter contact for transistor 19. N+ regions 31, 32 and 33 are ion implanted into P region 26 and underlie metal contacts 34, 35 and 36, respectively, for providing the collector contacts for transistor 11.

This portion of the monolithically integrated circuit may be electrically isolated from the remaining chip in a manner known to those skilled in the art by diffused isolations 37. Dielectric layer 38 overlies the chip also in a manner known to those skilled in the art.

When a logical high signal is applied to metal contact 27 (input terminal 18), electrons are injected into N− layer 25 from N+ region 28 through P region 26. N− layer 25 therefore is shorted to ground by the NPN action of N+ region 28, P region 26 and N− layer 25. P region 26 is above ground due to the PN junction with N+ region 28. Therefore, the PN junction between P region 26 and N− layer 25 is "on" and electrons are injected upward and collected by N+ regions 31, 32 and 33.

FIG. 3 shows an application that illustrates the flexibility of the Merged Collector Logic circuit described herein. NPN multi-emitter transistor 41 has collectors 42, 43 and 44 connected to output terminals 45, 46 and 47, respectively. In a like manner, NPN multi-emitter transistor 48 has collectors 49, 50 and 51 connected to output terminals 52, 53 and 54, respectively, and NPN multi-collector transistor 55 has collectors 56, 57 and 58 connected to output terminals 59, 60 and 61, respectively. The emitters of transistors 41, 48 and 55 are connected to the collectors of transistors 62 and 63, and may comprise a common buried layer when monolithically integrated. The base of transistor 41 is connected to input signal (A) terminal 64. Terminal 64 is coupled to supply voltage ($V_{CC}$) terminal 65 by resistor 66 and is connected to the base of transistor 62. The base of transistor 48 is connected to input signal (B) terminal 67. Terminal 67 is coupled to terminal 65 by resistor 68. The base of transistor 55 is connected to input signal (C) terminal 69. Terminal 69 is coupled to terminal 65 by resistor 71. The base of transistor 63 is connected to input signal (D) terminal 72 and terminal 72 is coupled to terminal 65 by resistor 73. The emitters of transistors 62 and 63 are connected to supply voltage (typically ground) terminal 74.

Increased logic flexibility is provided in that the outputs can be controlled by more than one input, i.e. A and D or B and C. As easily seen by those skilled in the art, output terminals 45, 46 and 47 coupled to transistor 41 will have the logic output A. Likewise, output terminals 52, 53 and 54 coupled to transistor 48 will have the logic output AB+BD. And, output terminals 59, 60 and 61 coupled to transistor 55 will have the logic output AC+CD.

By now it should be appreciated that there has been provided a logic circuit having increased packing density and flexibility. A buried epitaxial layer does not require connections made thereto and there are no Schottky contacts.

I claim:

1. A logic circuit having a supply voltage terminal, a plurality of input terminals and a plurlaity of output terminals, comprising:
    a first transistor having a base coupled to one of said input terminals, an emitter, and a plurality of collectors coupled to one each of said plurality of output terminals;
    a second transistor having a base coupled to said input terminal, an emitter coupled to said supply voltage terminal, and a collector coupled to said emitter of said first transistor;
    a plurality of transistors, each of said plurality of transistors having at least one collector coupled to one each of said plurality of output terminals, an emitter coupled to said emitter of said first transistor, and a base coupled to one of said plurality of input terminals; and
    a third transistor having a collector coupled to said emitters of said first transistor and said plurality of transistors, an emitter coupled to said supply voltage terminal, and a base coupled to one of said plurality of input terminals.

* * * * *